3,024,179
Patented Mar. 6, 1962

3,024,179

SEMICONDUCTOR DEVICE FABRICATION

Donald P. Sanders, Lansdale, Pa., assignor, by mesne assignments, to Philco Corporation, Philadelphia, Pa., a corporation of Delaware No Drawing. Filed Mar. 12, 1959, Ser. No. 798,825
11 Claims. (Cl. 204—143)

This invention relates to an improved process for fabricating a semiconductor device of the type comprising a germanium body having an indium coating applied to a surface region thereof. In particular it relates to an improved process for fabricating transistors having at least one surface-barrier electrode.

In order for a transistor to operate efficiently at very high frequencies, its base width (i.e. the thickness of semiconductive material separating opposed emitter and collector rectifying barriers) must be made extremely thin (e.g. of the order of 0.1 mil). However, if for any reason the base width becomes too thin, the punch-through voltage of the transistor will be reduced to such an extent as to render the transistor unusable. In the past difficulty has been experienced with such transistors because of the tendency of the base widths thereof to be reduced when they are stored or operated at elevated temperatures. Such reduction in base width apparently occurs because portions of the indium coating forming an electrode of the transistor dissolve the germanium therebeneath in a progressively penetrative manner, i.e. in a manner such as to extend progressively lengthening filaments of indium toward the rectifying barrier opposing the indium coating. The regions of the germanium base encroached by the indium filaments are termed solution cavities. As a result of this encroachment the punch-through voltage of the transistor progressively decreases until finally a short circuit occurs between the emitter and collector elements. While the foregoing dissolution process is slow in transistors stored or operated at about room temperature, it increases rapidly as the temperature at which the transistors are stored or operated increases. For example, in a surface-barrier transistor having indium emitter and collector electrodes and a germanium base 0.09 mil wide and maintained at 25° C., it is estimated that such a dissolution process would require about 340 years to produce a short circuit between the indium emitter and collector electrodes thereof. In contrast only about 83 days are required at 100° C.

The foregoing problem of basewidth reduction is not limited to surface-barrier transistors but arises also in other semiconductor devices having a thin germanium base and an indium coating thereon, e.g. microalloy and microalloy diffused-base transistors, and the thin-base surface-barrier diode described and claimed in the copending application of George C. Messenger, Serial No. 708,290, filed January 10, 1958, now U.S. Patent No. 2,987,658, entitled "Improved Semiconductor Diode" and assigned to the assignee of the present invention. In microalloy diffused-base transistors the reduction in base-width reduces the collector breakdown voltage to an unusably low value, while in thin-base diodes it reduces the peak inverse voltage thereof to an unusably low value.

Accordingly the object of the invention is to provide an improved method for fabricating semiconductor devices of the sort above-discussed having thin base widths, by which the tendency toward reduction in either punch-through or breakdown voltage is substantially reduced or eliminated.

In accordance with the invention this objective is achieved by applying to the indium electrode of a semiconductor device a quantity of an alloy consisting essentially of indium and tin and having a melting point below that of indium, heating said alloy to melt it and cause it to mix with the indium of the contact, and then cooling the resulting mixture. As will be explained hereinafter, these steps may be carried out at the same time and as a part of the usual procedure of attaching a lead wire to the indium contact. The procedure described above results in the production of a semiconductive device which is free from the aforementioned tendency toward reduction in either punchthrough or breakdown voltage. However, in following the procedure some tin will inevitably be deposited on the germanium surface surrounding the indium contact which, if permitted to remain, will cause the resultant transistor or diode to exhibit an excessively high reverse saturation current which in many instances will tend to increase as the device ages. To avoid this difficulty, in accordance with the invention the device is next subjected to an electrolytic etching treatment employing an alkaline etching solution to remove the residual tin from the germanium surface.

It is noted that, while it has heretofore been proposed to use tin-indium solder to attach lead wires to electrodes of transistors, the use of such solder resulted in the production of transistors having excessively high reverse saturation current. This was caused by the chemical redeposition of tin on the germanium surface immediately surrounding the electrodes when conventional acid clean-up etches were employed. I have discoverd that this difficulty can be avoided by using alkaline electrolytic clean-up etches. Accordingly my invention resides in the combination of the step of applying tin-indium alloy to an indium electrode of a semiconductive device to avoid reduction of either punchthrough or breakdown voltage due to the occurrence of solution cavities, with the step of using an alkaline electrolytic clean-up etch to prevent the device from having an excessively high reverse saturation current due to redeposition of tin on the germanium. This procedure has not heretofore been employed and yields unexpected and highly desirable results.

Other advantages and features of the invention will be apparent from a consideration of the following detailed description of the use of the method of the invention in the fabrication of a microalloy transistor. However, it is to be understood that the method is equally applicable to the fabrication of other semiconductor devices, e.g. surface-barrier and microalloy diffused-base transistors as well as thin-base surface-barrier diodes.

In the fabrication of one form of microalloy transistor, opposing surfaces of a wafer of n-type germanium having a resistivity of about one ohm-centimeter are electrolytically jet-etched in a manner such as to produce opposed coaxial depressions whose bottom surfaces are spaced from one another by a small distance, e.g. 0.1 mil, and are substantially plane and parallel to one another over substantial regions thereof. Indium is then jet-electroplated over those portions of the respective opposed plane regions on which the emitter and collector elements are to be formed.

To form the microalloy emitter element and to bond a lead wire thereto, the end of a lead wire having electrodeposited thereon a globule of a solder consisting predominantly of indium, and to a minor extent of gallium, is abutted against one of the indium platings. Heat is then applied to the solder and indium plating in an amount sufficient to cause them to intermix and dissolve a very small portion of the germanium underlying the plating. Immediately after the mixture of solder, indium plating and semiconductive material has formed, the latter mixture is cooled below its freezing temperature, thereby forming the emitter microalloy junction and bonding the lead wire thereto. Because the foregoing process is fully described and claimed in the copending patent application of Richard A. Williams, Serial No. 582,723, now Patent No. 2,930,108, filed May 4, 1956, entitled "Method for Fabricating Semiconductive Devices," and assigned to the assignee of the present application, further discussion thereof is not deemed necessary herein.

In accordance with prior practice it would then be customary to solder a lead wire to the indium plating which is to serve as the collector electrode of the transistor using a cadmium-indium alloy solder. In accordance with the present invention, however, a tin-indium alloy is substituted for the formerly used cadmium-indium alloy, which serves the dual purpose of soldering the lead wire to the indium plating while at the same time providing the advantage in accordance with the present invention of substantially reducing or eliminating the tendency toward reduction in punchthrough voltage. In order to minimize the amount of heating required to perform the soldering step, the tin-indium alloy preferably has a substantially eutectic composition, i.e. about 48 percent by weight of tin and about 52 percent by weight of indium. Such an alloy melts at 117° C. and is frequently referred to as "50–50" solder. The lead wire typically is composed of nickel and has a diameter between 1.5 and 3.0 mils.

More particularly, to facilitate soldering of the lead wire to the indium plating, a globule of the tin-indium solder is first electroplated in molten form onto an end of the wire, e.g. by the process described and claimed in United States Patent No. 2,818,375 to George L. Schnable, issued December 31, 1957, entitled "Method of Forming and Attaching Solder," and assigned to the assignee of the present application. A solution which is especially were suited for use in the electroplating of tin-indium eutectic onto the ends of nickel wires has the following composition:

| | Grams |
|---|---|
| Glycerol, minimum assay 95% by volume | 1600 |
| Stannous chloride, anhydrous | 40 |
| Indium trichloride, anhydrous | 200 |
| Ammonium chloride | 160 |

In preparing this solution, the three salts are dissolved into the glycerol by stirring for thirty-five minutes. The resultant mixture is then heated to a temperature between about 135° C. and 145° C. and is maintained within this temperature range for ten minutes while being stirred slowly. The resultant solution is next cooled to 120° C. and is then filtered under suction through a sintered glass filter. The filtrate is the tin-indium plating solution.

To plate a globule of tin-indium alloy onto the end of the lead wire, the following procedure can be employed. A suitable quantity of the above-described plating solution is established at a temperature between 135° C. and 145° C. A few mils of degreased nickel wire are then immersed therein and a potential difference of about 18 volts is applied between the wire and an inert anode, e.g. a carbon rod, also immersed therein. Under these conditions a molten tin-indium globule of substantially eutectic composition is plated onto the immersed end of the wire.

After being plated, the lead wire is preferably cleansed of plating solution by immersion in glycerol at 100° C. for at least 5 minutes and subsequent rinsing in deionized distilled water. The plated wire is then dried in the air.

The lead wire is now ready to be bonded to the indium plating on the germanium wafer. The end of the wire on which the tin-indium globule is plated is abutted against the indium plating. Next a small drop of a flux is applied to the indium plating. Preferably this flux consists of glycerol containing nine percent by weight of ammonium chloride and one percent by volume of concentrated (37%) hydrochloric acid. Heat is then applied to the tin-indium alloy. This heat may be applied radiatively or conductively via the wire. The amount of heat should be such that the solder flows to form a filleted joint as well as a mixture with the indium plating. However it should not be so great that the indium plating retracts from the germanium body or alloys substantially therewith. Moreover, to avoid excessive dissolution of tin by the flux, a brief soldering time is preferred, e.g. approximately 0.8 second, using the smallest amount of heat which can produce a satisfactory soldered joint.

After soldering has been completed, the remaining flux is removed from the unit by first rinsing it in hot (100° C.) glycerol for about 5 seconds, next rinsing it with hot (60° C.) deionized water and then drying it in air.

Next, according to the invention, the indium plating, the tin-indium alloy attached thereto and the region of the body adjoining and surrounding them are subjected to an electrolytic clean-up etch in an alkaline solution. Preferably the following procedure is employed:

A jet of an aqueous solution of an alkali-metal hydroxide, e.g. five normal potassium hydroxide, is directed against the region of the germanium wafer including the indium plating and tin-indium solder. Concurrently light is shined thereon to promote the generation of holes and thereby obtain smooth electrolytic etching. To produce electrolytic etching a voltage is applied between the jet as cathode and the lead wire, tin-indium solder and indium plating as anode. Typically this voltage has a value such as to produce an etching current of 12 milliamperes, the jet has a diameter of 20 mils, is at room temperature and is ejected under a pressure of 1.5 pounds per square inch, and the etching is continued for four seconds.

The etching step removes from the semiconductive body any tin which may have deposited thereon during the preceding steps, e.g. by reason of dissolution in the flux and redeposition therefrom. As hereinbefore noted, failure to remove this tin would cause the resultant transistor to exhibit an excessively high reverse saturation current ($I_{co}$) which in many instances would become even higher as the transistor aged. By contrast and as an important result of the invention, transistors having tin-indium soldered contacts and etched as just described exhibit satisfactorily low values of $I_{co}$ even when used for long periods of time at high temperatures.

After being etched the unit preferably is rinsed in hot (50–70° C.) deionized water for about 30 seconds. Next, to render the cleansed germanium surface resistance to contamination by substances deleterious to the electrical characteristics of the transistor, the still-wet wafer is immersed and agitated for about 10 seconds in an unstabilized concentrated (30 percent) aqueous solution of hydrogen peroxide having a temperature between about 55° C. and 65° C. Then the unit is removed from the peroxide solution and dried by a jet of filtered air. By this treatment a layer of germanium oxide is formed on the surface of the wafer, which insulates this surface against chemical contamination.

The unit may now be suitably potted and hermetically sealed into a metal container in accordance with well-known methods.

A microalloy transistor produced by the foregoing procedure displays no substantial decline in punchthrough voltage or increase in reverse saturation current even after long storage or operation at elevated temperatures.

The foregoing detailed example sets forth a preferred embodiment of the method of the invention. However it is to be understood that many modifications of this embodiment are feasible. For example the tin-indium solder need not be electroplated onto the wire lead. Alternatively the solder may be interposed in any suitable way between lead wire and indium plating at the time of soldering.

Furthermore while the tin-indium eutectic alloy is preferred because of its low melting point, the invention is not restricted to the use of this specific composition. All that is required is that the tin-indium alloy have a melting point lower than that of indium (155° C.). For example tin-indium alloys having melting points as high as 140° C. may be used. The tin content of such alloys lies in the range between about 13 and about 56 percent by weight.

Moreover the alkaline etching solution is by no means limited to potassium hydroxide having a normality of five. Thus the solution may comprise or even consist of alkali-metal hydroxides other than potassium hydroxide, e.g. sodium hydroxide. Furthermore the concentration of the alkali-metal hydroxide may be in the range of from about 1 to about 10 normal.

In addition, it is not necessary that the aqueous alkaline solution contain solely hydroxides. For example the solution may alternatively contain a mixture of an alkali-metal cyanide and an alkali-metal hydroxide, e.g. four molal sodium cyanide and one molal potassium hydroxide. Such a solution and a method for its use in cleansing transistors are described and claimed in the copending patent application of William Michlin, Serial No. 685,536, filed September 23, 1957, entitled "Electrochemical Method and Solution," and assigned to the assignee of the present application.

Furthermore the etching solution need not be applied in the form of a jet but may be daubed or dropped onto the indium plating and tin-indium solder as well as the region of the germanium wafer adjoining and surrounding them. Alternatively the wafer, plating and soldered connection may be immersed in the etching solution, although in the fabrication of microalloy diffused-base transistors the above-described techniques of applying etching solution are preferred.

Moreover while the foregoing example relates to the fabrication of a microalloy transistor, it is to be understood that the method of the invention is generally applicable to the manufacture of any semiconductor device having a germanium body and an indium coating thereon. For example the method is also applicable to the manufacture of surface-barrier transistors, microalloy diffused-base transistors and thin-base surface-barrier diodes.

In addition while the invention has been described in connection with a specific method for soldering a lead wire to an electrode the tin-indium alloy need not be used as a solder. On the contrary the beneficial result of inhibiting penetrative solution cavities may be achieved merely by melting the tin-indium alloy onto the indium coating. Furthermore this indium coating need not be applied to the germanium body by electroplating but instead may be applied by other well-known mthods, e.g. evaporation of the indium thereon.

While I have described my invention by means of specific examples and in a specific embodiment, I do not wish to be limited thereto, for obvious modifications will occur to those skilled in the art without departing from the scope of my invention.

What I claim is:

1. A process for fabricating a surface-barrier rectifier electrode on a surface portion of a germanium body, said process comprising the steps of: coating said surface portion of said geranium body with indium; applying to said coating an alloy consisting essentially of indium and tin and having a melting point below that of indium; heating said alloy to a temperature and for a time sufficient to melt it and cause it to mix with indium of said coating, the amount of said heating being less than either of the respective amounts of heating required to cause said coating to retract substantially from said body and to cause indium of said coating to alloy substantially with said body; cooling the resultant structure to solidify said mixture; applying an alkaline etching solution to a region of said body adjoining said coating, and passing an electric current through said solution in a sense causing electrolytic etching of said body region.

2. A process according to claim 1 wherein the concentration of tin in said alloy is between about 13 and about 56 percent by weight.

3. A process according to claim 1 wherein the concentration of tin in said alloy is about 48 percent by weight.

4. A process according to claim 1 wherein said etching solution comprises water and in alkali-metal hydroxide.

5. A process according to claim 1 wherein said etching solution consists essentially of water and a compound selected from the group consisting of sodium hydroxide and potassium hydroxide.

6. A process according to claim 1 wherein said etching solution consists essentially of water, an alkali-metal hydroxide and an alkali-metal cyanide salt.

7. A process according to claim 1 wherein alkaline etching solution is applied to said body by directing a jet of said solution against said coating, mixture and region, and said current is caused to pass through said solution by applying to said mixture a potential positive with respect to the potential of said jet.

8. In the fabrication of a transistor having an n-type germanium body and an indium surface-barrier rectifier electrode affixed thereto, a process for bonding a conductor to said electrode, conditioning said electrode to inhibit the formation of penetrative solution cavities in said germanium body by indium of said electrode and also conditioning said electrode to exhibit a satisfactorily low reverse saturation current, said process comprising the steps of: coating the end of said conductor with an alloy consisting essentially of tin and indium and having a melting point below that of indium, positioning said end adjacent said indium electrode; heating said alloy to a temperature and for a time sufficient to melt it and cause it to mix with indium of said electrode, the amount of said heating being less than either of the respective amounts of heating required to cause said electrode to retract substantially from said body and to cause indium of said electrode to alloy substantially with said body; cooling the resultant structure to solidify said mixture and bond said conductor to said electrode; applying an alkaline etching solution to a region of said body adjoining said electrode, and passing an electric current through said solution in a sense causing electrolytic etching of said body region.

9. A process according to claim 8 wherein the concentration of tin in said alloy is approximately 48 percent by weight, said etching solution consists essentially of water and constituents selected from the group consisting of at least one alkali-metal hydroxide and an alkali-metal hydroxide plus an alkali-metal cyanide, said solution is applied to said body by directing a jet of said solution against said electrode and region, and said current is caused to pass through said solution by applying between said conductor and said jet a voltage poled so that said conductor is positive with respect to said jet.

10. A process according to claim 1, wherein said body is composed of n-type germanium, the concentration of tin said alloy is between about 13 and about 56 percent by weight and said alkaline etching solution comprises at least one compound selected from the group consisting of sodium hydroxide and potassium hydroxide, the hydroxide concentration in said solution being between about one and about ten normal.

11. A process according to claim 8, wherein the concentration of tin in said alloy is between about 13 and about 56 percent by weight and said alkaline etching solution comprises at least one compound selected from the group consisting of sodium hydroxide and potassium hydroxide, the hydroxide concentration of said solution being between about one and about ten normal.

References Cited in the file of this patent

UNITED STATES PATENTS

| | | |
|---|---|---|
| 2,783,197 | Herbert | Feb. 26, 1957 |
| 2,793,420 | Johnston et al. | May 28, 1957 |
| 2,802,159 | Stump | Aug. 6, 1957 |
| 2,818,375 | Schnable | Dec. 31, 1957 |
| 2,846,346 | Bradley | Aug. 5, 1958 |